United States Patent
Hsu et al.

(10) Patent No.: US 11,319,513 B2
(45) Date of Patent: May 3, 2022

(54) NON-AQUEOUS TUNGSTEN COMPATIBLE METAL NITRIDE SELECTIVE ETCHANTS AND CLEANERS

(71) Applicant: AVANTOR PERFORMANCE MATERIALS, LLC, Center Valley, PA (US)

(72) Inventors: Chien-Pin Sherman Hsu, Berkeley Heights, NJ (US); Chun-Yi Sam Chiu, Center Valley, PA (US); Chu-Hung Wade Wei, Center Valley, PA (US); Mi Yeon Oh, Center Valley, PA (US)

(73) Assignee: AVANTOR PERFORMANCE MATERIALS, LLC, Center Valley, PA (US)

( * ) Notice: Subject to any disclaimer, the term of this patent is extended or adjusted under 35 U.S.C. 154(b) by 430 days.

(21) Appl. No.: 16/087,397

(22) PCT Filed: Mar. 23, 2017

(86) PCT No.: PCT/US2017/023797
§ 371 (c)(1),
(2) Date: Sep. 21, 2018

(87) PCT Pub. No.: WO2017/165637
PCT Pub. Date: Sep. 28, 2017

(65) Prior Publication Data
US 2020/0399565 A1 Dec. 24, 2020

Related U.S. Application Data

(60) Provisional application No. 62/312,689, filed on Mar. 24, 2016.

(51) Int. Cl.
*C09K 13/08* (2006.01)
*C11D 7/50* (2006.01)
(Continued)

(52) U.S. Cl.
CPC .............. *C11D 7/5022* (2013.01); *B08B 3/08* (2013.01); *C09K 13/08* (2013.01); *C09K 13/10* (2013.01);
(Continued)

(58) Field of Classification Search
CPC ... C09K 13/08; C09K 13/10; H01L 21/02057; C11D 7/5022; C11D 7/261; C11D 7/265;
(Continued)

(56) References Cited

U.S. PATENT DOCUMENTS

2002/0107160 A1 8/2002 Zazzera et al.
2005/0176603 A1 8/2005 Hsu
(Continued)

FOREIGN PATENT DOCUMENTS

KR 20090012953 A * 2/2009

OTHER PUBLICATIONS

PCT International Search Report corresponding to International Application No. PCT/US 17/23797, dated May 22, 2017.

*Primary Examiner* — Binh X Tran
(74) *Attorney, Agent, or Firm* — Hoffmann & Baron, LLP

(57) ABSTRACT

Provided therefore herein is a novel acidic fluoride activated cleaning chemistry. The present invention includes novel acidic fluoride activated, unique organic-solvent based microelectronic selective etchant/cleaner compositions with high metal nitride etch and broad excellent compatibility, including tungsten (W) and low-k. It does not use W-incompatible oxidizers, such as hydrogen peroxide or particle-generating corrosion inhibitors.

4 Claims, 1 Drawing Sheet

Graph to illustrate Nitridation Effects on TiN Etch Rates.

- Relative % Nitrogen of TiN films increase from 1X to 1.6-1.7X
⇒ TiN etch rates by 100:1 DHF decrease to < 1%
⇒ TiN etch rates by XM-7 decrease to <16%

(51) Int. Cl.
  *B08B 3/08*  (2006.01)
  *C09K 13/10*  (2006.01)
  *C11D 7/08*  (2006.01)
  *C11D 7/26*  (2006.01)
  *C11D 7/32*  (2006.01)
  *C11D 11/00*  (2006.01)
  *H01L 21/02*  (2006.01)

(52) U.S. Cl.
  CPC ............... *C11D 7/08* (2013.01); *C11D 7/261* (2013.01); *C11D 7/265* (2013.01); *C11D 7/3218* (2013.01); *C11D 11/0047* (2013.01); *H01L 21/02057* (2013.01)

(58) Field of Classification Search
  CPC ..... C11D 7/08; C11D 7/3218; C11D 11/0047; B08B 3/08
  USPC ............................................... 252/79.3, 79.4
  See application file for complete search history.

(56) References Cited

U.S. PATENT DOCUMENTS

| | | | |
|---|---|---|---|
| 2006/0255315 A1 | 11/2006 | Yellowaga et al. | |
| 2008/0242574 A1* | 10/2008 | Rath | C11D 7/08 510/176 |
| 2009/0192065 A1* | 7/2009 | Korzenski | G03F 7/425 510/176 |
| 2016/0056054 A1* | 2/2016 | Takahashi | H01L 21/324 438/754 |

\* cited by examiner

Graph to illustrate Nitridation Effects on TiN Etch Rates.
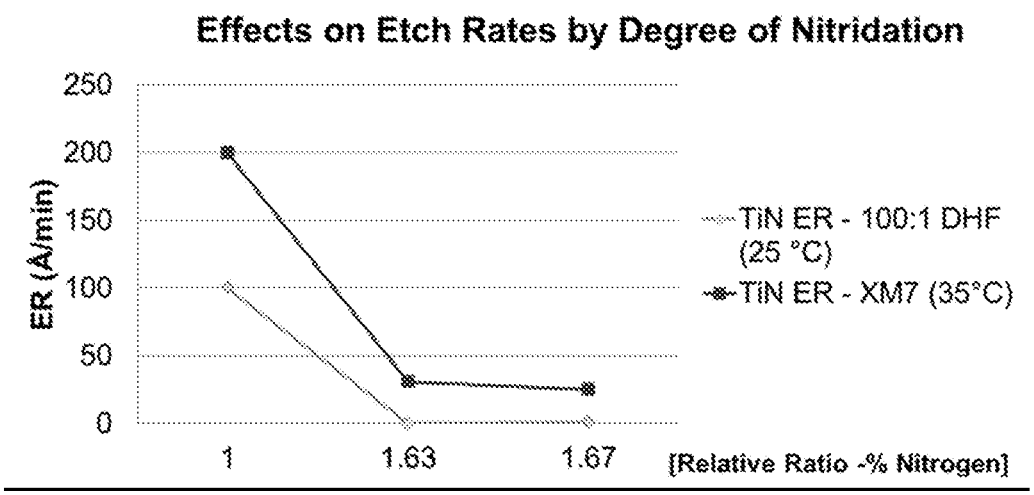
- Relative % Nitrogen of TiN films increase from 1X to 1.6-1.7X
⇒ TiN etch rates by 100:1 DHF decrease to < 1%
⇒ TiN etch rates by XM-7 decrease to <16%

NON-AQUEOUS TUNGSTEN COMPATIBLE METAL NITRIDE SELECTIVE ETCHANTS AND CLEANERS

CROSS-REFERENCE TO RELATED APPLICATION

This application is the U.S. National Phase of, and Applicant claims priority from, International Patent Application No. PCT/US2017/023797, filed on Mar. 23, 2017, which claims priority from U.S. Provisional Application Ser. No. 62/312,689 filed Mar. 24, 2016, each of which is incorporated herein by reference.

BACKGROUND

The present invention relates to a composition and process for selectively cleaning and etching microelectronic substrates, including metal nitride and/or photoresist etch residues in the presence of metal conductor and insulator materials (i.e., low-k dielectrics).

The recent advances in production of micro- and nanoelectronic devices has resulted in the need for new stripping and cleaning compositions with both front end of the line (FEOL) and back end of the line (BEOL) stripping or cleaning capabilities. The cleaning compositions typically employed heretofore have been found to be unsuitable for new materials employed in production of microelectronic or nanoelectronic platforms. The previously employed stripping or cleaning compositions are either too aggressive and/or are not selective enough. Among the newly utilized materials employed to produce these newer microelectronic or nanoelectronic devices are materials such as low-$k$ (<3) and high-$k$ (>20) and porous dielectrics, copper metallizations, fluoropolymer antireflective coatings (ARCs), special hard masks such as those composed of Ti and TiN, strained wafers of Si/Ge or Ge, and metal capping layers such as those of CoWP and CoWB. These new materials present new and difficult challenges to the device manufacturer.

Photoresist masks, for example, are commonly used in the semiconductor industry to pattern materials such as semiconductors or dielectrics. In one application, photoresist masks are used in a dual damascene process to form interconnects in the back-end metallization of a microelectronic device. The dual damascene process involves forming a photoresist mask on a low-k dielectric layer overlying a metal conductor layer, such as a copper layer. The low-k dielectric layer is then etched according to the photoresist mask to form a via and/or trench that expose the metal conductor layer. The via and trench, commonly known as dual damascene structure, are usually defined using two lithography steps. The photoresist mask is then removed from the low-k dielectric layer before a conductive material is deposited into the via and/or trench to form an interconnect.

With the decreasing size of microelectronic devices, it becomes more difficult to achieve the critical dimensions for vias and trenches. Thus, metal hard masks are used to provide better profile control of vias and trenches. The metal hard masks can be made of titanium or titanium nitride, and are removed by a wet etching process after forming the via and/or trench of the dual damascene structure. It is essential that the wet etching process uses a removal chemistry that effectively removes the metal hard mask and/or photoresist etch residues without affecting the underlying metal conductor layer and low-k dielectric material. In other words, the removal chemistry is required to be highly selective to the metal conductor layer and low-k dielectric layer.

Despite their popularity, many difficulties persist when using acidic fluoride based chemistries as selective metal nitride etch, in particular. It is particularly important that such cleaners and etchants have wide substrate and metal compatibilities, including W and low-k dielectric materials; in particular, with metal nitrides, such as titanium nitride (TiN), tantalum nitride (TaN) and tungsten nitride (WN).

Current metal nitride etch chemistries include, for example; Alkaline hydrogen peroxide-based chemistry, (e.g. 5:1:1 $H_2O$—30% $NH_4OH$-30% $H_2O_2$). Such compositions however, are not W compatible. Hydrofluoric acid based chemistries, such as 10:1 or 100:1 diluted HF aqueous solutions. However, they have very low TiN etch rates and poor substrate compatibilities with common substrates, such as silicon oxide (e.g. TEOS).

Most metal nitride etch technologies are water-based formulations. Corrosion inhibitors are commonly used. They all suffer one or more of the following drawbacks: low metal nitride etch rates, particle generation from the compositions (likely involve corrosion inhibiting additives), and poor or limited compatibility with substrates or metallization, including W.

Accordingly, an object of the present invention is to provide improved compositions and methods for cleaning and etching microelectronic substrates. It is desirious to provide compositions with high metal nitride etch and broad, excellent compatibility, including tungsten (W) and low-k dielectric material. Our invention describes acidic metal nitride select etchants/cleaners for microelectronic device fabrications in advanced technology nodes.

SUMMARY OF THE INVENTION

The present invention relates to a composition and process for selectively etching hard mask layers and/or photoresist etch residues relative to metal conductor layers and low-k dielectric layers that are present. More specifically, the present invention relates to a composition and process for selectively etching titanium nitride and/or photoresist etch residues relative to copper, tungsten, and low-k dielectric layers.

The present invention includes a non-aqueous cleaning composition for micro-electronics applications comprising about 0.01% to about 5.0% by weight of a fluoride activating agent, about 0.01% to about 20.00% by weight of at least one oxidizer, about 80.00% to about 99.90% by weight of an anhydrous organic solvent, wherein said cleaning composition has a pH equal to 5.5 or less, and wherein said oxidizer is not hydrogen peroxide.

In an embodiment, the non-aqueous cleaning composition also has etch capabilities. The non-aqueous cleaning also is compatible with tungsten and low-κ dielectric substrates.

In an embodiment, the non-aqueous cleaning composition includes about 0.05% to about 1.00% by weight of a fluoride activating agent, about 0.01% to about 5.00% by weight of at least one oxidizer, and about 85.00% to about 99.90% by weight of an anhydrous organic solvent. In another embodiment, the non-aqueous cleaning composition includes about 0.10% to about 0.50% by weight of a fluoride activating agent, about 0.01% to about 2.00% by weight of at least one oxidizer, and about 90.00% to about 99.00% by weight of an anhydrous organic solvent.

In another embodiment, the non-aqueous cleaning composition of the present invention further includes a co-solvent. In another embodiment, the non-aqueous cleaning composition includes one or more ingredient selected from the group comprising a pH-adjusting agent, an amine, acids, a corrosion control agent, and a surfactant.

In yet another embodiment, the fluoride activating agent of the cleaning composition is selected from the group of hydrogen fluoride, ammonium fluoride, potassium fluoride, alkali metal fluorides, tetraalkylammonium fluoride, fluoroboric acid, ammonium tetrafluoroborate, alkali metal tetrafluoroborate, tetraalkylammonium tetrafluoroborate, and trimethyloxonium tetrafluoroborate. In another embodiment, the at least one oxidizer is selected from the group of nitric acid, sulfuric acid, sulfonic acid, periodic acid, ammonium persulfate, peroxymonosulfuric acid, perborates, percarbonates, persulfates, ozone and ozonides.

In an embodiment, the anhydrous organic solvent of the cleaning composition is selected from the group of sulfones, sulfides, carbonates, alcohols, glycols and amides. In a preferred embodiment, the anhydrous organic solvent is sulfolane.

A method of cleaning a mirco-electronic substrate is also provide herein. The method includes contacting the microelectronic substrate with a cleaning composition comprising about 0.01% to about 5.0% by weight of a fluoride activating agent, about 0.01% to about 20.00% by weight of at least one oxidizer, about 80.00% to about 99.90% by weight of an anhydrous organic solvent, wherein said cleaning composition has a pH equal to 5.5 or less, and wherein the oxidizer is not hydrogen peroxide.

For a better understanding of the present invention, together with other and further objects and advantages, reference is made to the following detailed description, taken in conjunction with the accompanying examples, and the scope of the invention will be pointed out in the appended claims. The following detailed description is not intended to restrict the scope of the invention by the advantages set forth above.

BRIEF DESCRIPTION OF THE DRAWINGS

FIG. 1 shows the effects of etch rates by degree of nitridation.

DETAILED DESCRIPTION

The present invention describes novel acidic fluoride-activated, unique organic-solvent based microelectronic selective etchant/cleaner compositions with high metal nitride etch and broad, excellent compatibility, including tungsten (W) and low-k. It does not use W-incompatible oxidizers, such as hydrogen peroxide or particle-generating corrosion inhibitors.

The aforementioned chemistries can be formulated into from highly non-aqueous to semi-aqueous solutions or slurries. They can be used to selectively remove metal nitrides. They can also provide effective and/or applicable for stripping ARC and photoresists, cleaning residues from plasma process generated organic, organometallic and inorganic compounds, cleaning residues from planarization process, such as chemical mechanical polishing, and using as additives in planarization slurry/liquids.

In general, the present invention also relates to semi-aqueous compositions and processes for selectively etching hard mask layers and/or photoresist etch residues relative to metal conductor layers and low-k dielectric layers that are present. More specifically, the present invention relates to a semi-aqueous composition and process for selectively etching titanium nitride and/or photoresist etch residues relative to copper, tungsten, and low-k dielectric layers. Other materials that may be present on the microelectronic device, should not be substantially removed or corroded by said compositions.

As used herein, the term "microelectronic device" refers to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

As used herein the term, "titanium nitride" and "$TiN_x$" refers to pure titanium nitride as well as impure titanium nitride including varying stoichiometries, and oxygen content ($TiO_xN_y$).

As used herein the term, "about" refers to .+−0.5% of the stated value.

As used herein the term, "low-k dielectric material" refers to any material used as a dielectric material in a layered microelectronic device, wherein the material has a dielectric constant less than about 3.5.

Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As used herein, the term "non-aqueous" refers to a mostly organic composition, with only minute amount of water in the composition, such that the water will not lead to damage of the mirco-electronic substrate. In an embodiment, the composition may have 5% or less water by weight. In a preferred embodiment, the composition will have 3% or less water by weight.

The present compositions and methods have been found to have the following beneficial effects:
Unexpected Dramatic Solvent Effects on Metal Nitride Etch Rates and Other Compatibilities:
  a) Organic Solvent Effects: Keeping all the other components at the same contents, the only variable is organic solvent contents: all formulations show low TiN etch rates (<2 Å/min at 65° C.; <6 Å/min at 85° C.), except Example 20, which uses sulfolane as organic solvent, demonstrates unexpected high TiN etch rates at >50-100× levels (109 Å/min at 65° C.; >400 Å/min at 85° C.). Such dramatic solvent effects are not normally expected. Fully aqueous compositions (e.g. Example 104) also have highly elevated Al etch rates (>2,000 Å/min). [See Table 1A and 1B].
  b) High Effects on Etch Rates by Water Contents: Comparing to many common water-based etchants, our inventions uses practically anhydrous to highly non-aqueous matrices. Water contents show unusually high effects on etch rates and compatibilities (Table 2A and 2B). When additional 2% or more water are added, unfavorably increases of W etch rates have been found.
Unusually High Metal Nitride Etch Rates and Broad Substrate Compatibility at the Same Time:
  a) Nitridation Effects on TiN Etch Rates: Nitridation (% nitrogen) of titanium increases Ti hardness and makes TiN to resist etching. When nitridation levels increases, TiN etch becomes even harder. Table 3A and FIG. 1 demonstrate such effects. A commercial TiN sample (e.g. PVD TiN #1 from Advantiv) with lower nitridation contents can be etched by 100:1 DHF. However, common TiN samples with higher nitridation levels, which are commonly used in advanced technology such as 20 nm or below nodes, can not be etched at all by 100:1 DHF. This highlights the needs of developing new novel metal nitride etch chemistries.

b) High Metal Nitride Etch Rates: For acidic fluoride-activated etch chemistries, there have been big issues and challenges—Low metal nitride etch rates by common/standard etchants such as DHF solutions, see discussion above in section 2a). Our chemistries provide superior etch rates, readily above 100 Å/min, exceeding 600-700 Å/min by selected formulations. (Table 4).

c) Superior, Differentiating Selectivity from Common Cleaners/Etchants: SC-1 chemistry such as 5:1:1 $H_2O$—29% $NH_4OH$—30% $H_2O_2$ is capable of providing good TiN etch rates, but is not compatible with W. HF-based chemistries, such as 10:1 DHF, have low TiN etch rates and unacceptably high silicon oxide (TEOS) etch rates. (Table 4). Our select etch chemistries not only provide high metal nitride etch rates, but also provide excellent compatibilities to W, TEOS and other substrates.

d) Unique Etch Selectivity between TiN Hard Mask (HM) and TiN Liner of W-Plug/Fill: Selected compositions from our chemistry platforms are further coupled with electrochemistry designs to provide excellent galvanic controls to have no or minimum TiN etch next to W metals, such as TiN liner for W plugs. Examples are 1B, 4A, and 6. (see Table 5).

e) Additional Examples of our select etch chemistry platform—see Table 6, 7, and 8.

Note: some compositions include excellent Al compatibility (e.g. Example 1).

In our invention, we specify select metal nitride etch cleaners/etchants using special solvent matrices, oxidizers and selected fluorides to offer surprisingly highly efficient metal nitride etch, wide and excellent compatibility with metallization and substrates, including W, TEOS, low-k and others.

This invention describes acidic, organic-solvent based microelectronic selective etchant/cleaner compositions with high metal nitride etch and broad, excellent compatibility, including tungsten (W) and low-k. They comprise:

(A) Fluoride compounds as the primary fluoride-activating agents, in an amount of 0.01 to 5% by weight. Preferably, 0.05-1% wt., and more preferably 0.1-0.5% wt. They include hydrogen fluoride, ammonium fluoride, potassium fluoride, alkali metal fluorides, tetraalkylammonium fluoride, Fluoroboric acid, ammonium tetrafluoroborate, alkali metal tetrafluoroborate, tetraalkylammonium tetrafluoroborate, trimethyloxonium tetrafluoroborate and others.

(B) Oxidizer, one or more, excluding hydrogen peroxides. Oxidizers include nitric acid, sulfuric acid, sulfonic acid, periodic acid, ammonium persulfate, peroxymonosulfuric acid, perborates, percarbonates, persulfates, ozone and ozonides; in an amount of 0.01 to 20% by weight; preferably, 0.01-5% wt.; and more preferably 0.01-2% wt.

(C) Low water or anhydrous organic solvents. One or more organic solvents may be used. In an amount of 80 to 99.9% by weight. Preferably, 85-99.9% wt., and more preferably 90-99%. The Organic Solvents are selected from sulfones, sulfides, carbonates, alcohols, glycols and amides. Most preferably sulfones, such as sulfolane, and dimethyl sulfone. Sulfones may be used as the only organic solvent or as the primary solvent in combination with other co-solvents. Other suitable solvents or co-solvents, include propylene carbonate, carbitol, ethylene glycol, dimethyl sulfoxide, N-methyl pyrrolidone (NMP) and others.

Alcohols, alcohol-ethers and ethers can be used as optional co-solvents. Preferably, they are used as minor co-solvents. In an amount of 0 to 49% by weight. Preferably, 0-25% wt., and more preferably 0-20%. Examples: ethylene glycol, propylene glycol, glycerol, diethylene glycol (DEG), carbitol, polyethylene glycol (PEG), butyl diglycol, tetraethylene glycol, ethylene glycol butyl ether (EGBE; evaporation rate 0.07), diethylene glycol monoethyl ether (DEGME; evaporation rate 0.02), carbitol, butyl diglycol, tetraethylene glycol, dipropylene glycol methyl ether (DPGME).

(D) Low Water compositions. The water content of the compositions in this invention are controlled in the amount of 10% or less. Preferably, in the amount of 5% or less. Most preferably, in the amount of 3% or less.

(E) The pH (pH of 10% diluted aqueous solutions or apparent pH) should be equal or less than 5.5, more preferably equal or less than 5.0, most preferably equal or less than 4.

(F) No additional corrosion inhibitor is required in our inventions. This eliminates particle generation from added corrosion inhibitors.

(G) Optional: pH-adjusting agents, amines (e.g. monoethanolamine), acids (e.g. hydrochloric acid, acetic acid), corrosion control agents (e.g. benzotriazole, tetrazole, citric acid, catechol) and surfactants (amphoteric, cationoic and anionic and non-ionic surfactants) such as Surfynol-61, Surfynol-465 and Du Pont Zonyl FSH. Any of the above additives must be compatible with our basic compositions and free from (undesirable) particle generations.

TABLE 1A

Compositions showing solvent effects on Etch Rates and Compatibilities

| Example No. | Solvent/ wt % | 70%HNO3, wt % | 49%HF, wt % | H2SO4, wt % |
|---|---|---|---|---|
| 100 | DMSO 96.2 | 1 | 0.8 | 2 |
| 101 | CAR 96.2 | 1 | 0.8 | 2 |
| 102 | EGBE 96.2 | 1 | 0.8 | 2 |
| 103 | NMP 96.2 | 1 | 0.8 | 2 |
| 104 | H2O 96.2 | 1 | 0.8 | 2 |
| 20 | SFL 96.2 | 1 | 0.8 | 2 |

TABLE 1B

Etch Rates (Å/min) of 3 Different Films showing dramatic solvent effects

| Wafer Descriptions | Temp | 100 | 101 | 102 | 103 | 104 | 20 |
|---|---|---|---|---|---|---|---|
| PVD TiN | 65 C. | 0 | 2 | 0 | 0 | 0 | 109 |
|  | 85 C. | 4 | 2 | 2 | 0 | 6 | >400 |
| Al | 65 C. | 22 | 18 | 5 | 13 | >2000 | 6 |
|  | 85 C. | 30 | 25 | 19 | 15 | >2000 | 10 |
| AlN | 65 C. | 38 | 26 | 18 | 29 | 53 | 24 |
|  | 85 C. | 60 | 44 | 24 | 70 | 92 | 42 |

TABLE 2A

Compositions to demonstrate Water Effects on Etch Rates.

| Chemical Description- Example No. | SFL | 70%HNO3 | 49%HF | 50%HBF4 | 97%H2SO4 | H2O |
|---|---|---|---|---|---|---|
| 2D | 96.1 | 08 | 01 | 1 | 2 | — |
| 2D-A | 96.1 | 08 | 01 | 1 | 2 | 0.5 |
| 2D-B | 96.1 | 08 | 01 | 1 | 2 | 1 |
| 2D-C | 96.1 | 08 | 01 | 1 | 2 | 2 |
| 2D-D | 96.1 | 08 | 01 | 1 | 2 | 3 |

TABLE 2B

Water Effects on Etch Rates.
High effects on W etch rates are shown.

| Wafer Description | 2D | 2D-A | 2D-B | 2D-C | 2D-D |
|---|---|---|---|---|---|
| PVD TiN | 32 | 29 | 27 | 32 | 27 |
| SiCN | 1.4 | 1.4 | 0. | 0.8 | 0.8 |
| W | 4 | 3.8 | 5 | 8.4 | 10.2 |
| WN | 9 | 8 | 5 | 9 | 5 |
| TEOS | 4.8 | 5.2 | 4.8 | 5 | 3.8 |
| Thermal oxide | 1.6 | 1.4 | 1.2 | 1.8 | 1.2 |

TABLE 3A

Nitridation Effects on TiN Etch Rates.

| Sample Description | Atomic % Nitrogen | Atomic % Titanium | Etch Rate (Å/min) By 100:1 DHF at 25° C. | Etch Rate (Å/min) By XM-7 at 35° C. |
|---|---|---|---|---|
| PVD TiN #1 | 1X (Standard) | 1Y | >100 | 200 |
| PVD TiN #2 | 1.63X | 0.31Y | 0 | 31 |
| CVD TiN #3 | 1.67X | 0.27Y | 1 | 25 |

XM-7 = Example 20.
PVD TiN #1 samples - from Advantiv, used as "standard" in this comparison.
% N = 24.3 weight %; 52.3 atomic %

TABLE 4

Select Metal Nitride Etch - Etch Rates Comparisons

| Etch Chemistry Description | TiN (PVD) | TiN (CVD) | TaN | WN | W | TEOS |
|---|---|---|---|---|---|---|
| 5:1:1 H2O—30% NH4OH—30% H2O2 [SC-1], 65 C. | >340 | >600 | 2 | >130 | >5400 | 9 |
| 10:1 DHF, 25 C. | 3 | 12 | 10 | 0 | 0 | 1420 |
| Ex. 3, 70 C. | 180 | >600 | 28 | 0 | 0.4 | 5 |
| Ex. 2A, 70 C. | 120 | >600 | 14 | 5 | 0.8 | 5 |
| Ex. 2B, 70 C. | 710 | >600 | 115 | 0 | 1.3 | 8 |
| Ex. 2D, 70 C. | — | — | — | 33 | 2 | 3 |
| Ex. 2E, 70 C. | — | — | — | 23 | 0.2 | 3 |

SC-1: Effective TiN, WN etch; low TaN etch; NOT W- Compatible
10:1 DHF; Low TiN etch; W-Compatible; NOT TEOS-Compatible
Exs. 3, 2A, 2B, 2D, and 2E Etch; High TiN, TaN or WN etch; W-Compatible
All chemistries are peroxide-free, except SC-1

TABLE 5

Etch Rate (ER), Corrosion Potentials (ΔEcorr) and Select TiN Etch compositions

| Wafers and Process Descriptions | Ex. 14/ Treatment time in ER measurement | Ex. 4A/ Treatment time in ER measurement | Ex. 6/ Treatment time in ER measurement |
|---|---|---|---|
| Fab 1 PVD TiN ER; 70 C. (A/m) | 120 (0.2') | 121 (0.2') | 108-144 (0.2') |
| Fab 2 PVD TiN ER; 70 C. (A/m) | 110 (65C) | 121 (1') | 73 (1') |
| ΔEcorr (W to Fab1 PVD TiN; 70 C.) | +0.052 | −0.005 | −0.123 |
| ΔEcorr (W to Fab1 CVD TiN; 70 C.) | +0.101 | +0.049 | — |
| ΔEcorr ( W to Fab2 PVD TiN; 65 C.) | −0.066 | — | — |
| TiN Liner Compatibility (Structured Wafer Test) | Fab 2: 30 C., pull back −100% intact; 65 C., Total Removal, minor liner etch, >90% intact | Fab 2: 70 C., total removal, liner slight etch, >98% intact; | Fab 1: 70 C., TiN small remain; No Liner damage, >99% intact |

TABLE 6

Select Etch Compositions and Etch Rates

| Example No. | SFL | 70% HNO3 | 50% HBF4 | H2O | PVD TiN Blanket (Advantiv) | Fab 2 PVD TiN | Fab 3 TiN Etch rate |
|---|---|---|---|---|---|---|---|
| 14 | 96.5 | 1.5 | 2 | 0 | 47.69 | 8.56 | 8.88 |
| 15 | 96 | 1.5 | 2 | 0.5 | 43.91 | 6.50 | 8.25 |
| 16 | 95.5 | 1.5 | 2 | 1 | 44.04 | 5.17 | 6.94 |
| 17 | 94.5 | 1.5 | 2 | 2 | 47.86 | 4.41 | 5.81 |
| 18 | 91.5 | 1.5 | 2 | 5 | 43.88 | 2.21 | 4.01 |

TABLE 7

Select Etch Compositions and Etch Rates

| Example No. | SFL | 70% HNO3 | 49% HF | H2O | PVD TiN Blanket (Advantiv) | Fab 2 PVD TiN | Fab 3 TiN Etch rate |
|---|---|---|---|---|---|---|---|
| 9 | 96.5 | 1.5 | 0.5 | 0 | 47.40 | 17.57 | 21.62 |
| 10 | 96 | 1.5 | 0.5 | 0.5 | 44.12 | 13.14 | ND |
| 11 | 95.5 | 1.5 | 0.5 | 1 | 51.04 | 10.32 | 19.62 |
| 12 | 94.5 | 1.5 | 0.5 | 2 | 44.46 | 1.84 | ND |
| 13 | 91.5 | 1.5 | 0.5 | 5 | 29.42 | 0.74 | 10.97 |

TABLE 8

Etch Rates of Select Metal Nitride Etchants/Cleaners

| Example No. | Temp | TiN | TaN | SiN | Low-k | BARC | HfOx | W | Al |
|---|---|---|---|---|---|---|---|---|---|
| 1 | 70 C. | 180 | 12 | 5 | <2 | >100 | 14 | 0.4 | 4 |
| 4A | 70 C. | 125 | 6 | 1.5 | <2 | >100 | 7 | 0.4 | 9 |
| 8 | 45 C. | 20 | <0.9 | 0.7 | <3 | <0.4 | 5.4 | 3 | >800 |
|  | 55 C. | 73 | <0.9 | 2.4 | — | <0.4 | >16 | 15 | >800 |
|  | 65 C. | 150 | 0.9 | 6 | — | 0.4 | >16 | 40 | >800 |
| 100:1 DHF | 25 C. | 3 | 1 | 7 | — | — | 2 | 2 | >500 |
| SC-1 (5:1:1) | 65 C. | >100 | 0 | 1 | — | >100 (lift-off) | 0.1 | >500 | >800 |

TABLE 9 compositions of the present invention

| Compositions-Example No. | SFL (anhydrous) | 70% HNO3 | 49% HF | 50% HBF4 | H2SO4 | Additive |
|---|---|---|---|---|---|---|
| 1 | 98.5 | 1 | 0.5 | | | |
| 1A | 98.8 | 1 | 0.2 | | | |
| 2 | 97.2 | 0.8 | 0.5 | 0.5 | 1 | |
| 2A | 95.7 | 0.8 | 0.5 | 1 | 2 | |
| 3 | 97.8 | 1 | 0.2 | | 1 | |
| 2B | 96 | 1 | 1 | 1 | 1 | |
| 2C | 96.8 | 0.8 | 0.7 | 0.5 | 1 | 0.2 Glycerol |
| 2D | 96.1 | 0.8 | 0.1 | 1 | 2 | |
| 2E | 96 | 0.8 | 0.1 | 1 | 2 | 0.1 Citric acid |
| 4 | 93.2 | 1 | 0.8 | 5 | | |
| 1B | 96.5 | 1.5 | | 2 | | |
| 5 | 98 | 0.5 | 0.3 | | 0.5 | |
| 4A | 97 | 1.5 | | 1.5 | | |
| 4B | 97 | 0.8 | 0.2 | 1 | 1 | |
| 3A | 97.7 | 1 | 0.3 | | 0.5 | |
| 6 | 98 | 0.5 | 0.3 | | 0.5 | |
| 7 | 98 | 1 | 0.7 | | | 0.3 Triethanolamine |

Thus while there have been described what are presently believed to be preferred embodiments of the invention, those skilled in the art will realize that changes and modifications may be made thereto without departing from the spirit of the invention, and it is intended to claim all such changes and modifications as fall within the true scope of the invention.

What is claimed is:

1. A non-aqueous cleaning composition for micro-electronics applications consisting essentially of:
    about 0.2% to about 1.5% by weight of a fluoride activating agent, wherein said fluoride activating agent is hydrogen fluoride, Fluoroboric acid, or a combination of hydrogen fluoride and Fluoroboric acid,
    about 1.0% to about 2.8% by weight of at least one oxidizer, wherein said one oxidizer is nitric acid or a combination of nitric acid and sulfuric acid, and
    about 93.2% to about 98.8% by weight of an anhydrous organic solvent, wherein said anhydrous organic solvent is sulfolane,
    wherein said cleaning composition has a pH equal to 5.5 or less, and wherein said composition is in the absence of hydrogen peroxide.

2. The non-aqueous cleaning composition according to claim 1 wherein said cleaning composition also has etch capabilities.

3. The non-aqueous cleaning composition according to claim 1 wherein said cleaning composition is compatible with tungsten and low-κdielectric substrates.

4. A method of cleaning a mirco-electronic substrate comprising contacting said micro-electronic substrate with a cleaning composition consisting essentially of:
- about 0.2% to about 1.5% by weight of a fluoride activating agent, wherein said fluoride activating agent is hydrogen fluoride, Fluoroboric acid, or a combination of hydrogen fluoride and Fluoroboric acid,
- about 1.0% to about 2.8% by weight of at least one oxidizer, wherein said one oxidizer is nitric acid or a combination of nitric acid and sulfuric acid, and
- about 93.2% to about 98.8% by weight of an anhydrous organic solvent, wherein said anhydrous organic solvent is sulfolane,
- wherein said cleaning composition has a pH equal to 5.5 or less, and wherein said composition is in the absence of hydrogen peroxide.

* * * * *